US006906399B2

(12) United States Patent
Fruth et al.

(10) Patent No.: US 6,906,399 B2
(45) Date of Patent: Jun. 14, 2005

(54) INTEGRATED CIRCUIT INCLUDING SEMICONDUCTOR POWER DEVICE AND ELECTRICALLY ISOLATED THERMAL SENSOR

(75) Inventors: John R. Fruth, Kokomo, IN (US); Scott B. Kesler, Kokomo, IN (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 10/287,034

(22) Filed: Nov. 4, 2002

(65) Prior Publication Data

US 2004/0084753 A1 May 6, 2004

(51) Int. Cl.[7] .................... H01L 27/82

(52) U.S. Cl. .................... 257/577; 257/48; 361/93.8; 361/103

(58) Field of Search .................... 257/467, 470, 257/49; 324/158.1, 755, 760; 361/93.8, 103, 104; 374/165, 170, 174, 177

(56) References Cited

U.S. PATENT DOCUMENTS 4,760,434 A * 7/1988 Tsuzuki et al. ............... 257/49
5,049,961 A 9/1991 Zommer et al. .............. 357/28
5,237,481 A 8/1993 Soo et al. .................. 361/103
5,427,975 A 6/1995 Sparks et al. ................. 438/52
5,723,916 A 3/1998 Disney et al. .............. 307/131
6,472,251 B1 10/2002 Myer et al. ................. 438/123
6,619,556 B1 9/2003 Snider et al. .............. 236/49.3

* cited by examiner

*Primary Examiner*—Minhloan Tran
*Assistant Examiner*—Thomas L Dickey
(74) *Attorney, Agent, or Firm*—Stefan V. Chmielewski

(57) ABSTRACT

An integrated circuit (10) includes a thermal sensing device (20) and a power-switching device (12) such as an IGBT. The power device (12) is fabricated in a conventional manner on a semiconductor substrate, and the thermal sensing device (20) is fabricated on an electrical insulation layer (74) formed over the substrate. The thermal sensing device (20) may be provided in the form of a number of series-connected polysilicon diodes (D1–D3) positioned adjacent to the power device (12) such that the operating temperature of the thermal sensing device (20) is near that of the power device (12). In response to an input current $I_C$, the thermal sensing device (20) produces an output voltage ($V_D$) that is substantially linear with surface die temperature, and which reacts rapidly to changes in surface die temperature. The thermal sensing device (20) is completely electrically isolated from the power device, thereby eliminating any electrical interaction therebetween.

9 Claims, 3 Drawing Sheets

10 E G T+ T- 84 74 72 80 82 86 88 90 92 80 72 73 66 68 68 76 78 76 78 76 78 74 70 64 62 60 C

INTEGRATED CIRCUIT INCLUDING SEMICONDUCTOR POWER DEVICE AND ELECTRICALLY ISOLATED THERMAL SENSOR

TECHNICAL FIELD

The present invention relates generally to semiconductor power devices, and more specifically to semiconductor power devices including a thermal sensing device operable to sense the power device operating temperature.

BACKGROUND OF THE INVENTION

Thermal considerations are invariably part of the design of any system using a power silicon switch, including DMOS (power MOSFET), insulated gate bipolar transistor (IGBT) or other power switches. Such devices are designed to sink or source large currents that generate electrical power resulting in elevated device temperatures. However, most silicon-based power devices have a limited maximum allowable operating temperature for reliable operation. It is therefore desirable to be able to accurately determine the operating temperature of such power devices so that suitable control circuitry can be employed to control power device operation in a manner that limits the maximum power device operating temperature to within safe operating limits.

SUMMARY OF THE INVENTION

The present invention comprises one or more of the following features or combinations thereof. A semiconductor integrated circuit including a power device fabricated on a semiconductor substrate, an electrical insulation layer formed over the semiconductor substrate, and a thermal sensing device fabricated on the electrical insulation layer and thereby electrically insulated from the power device, wherein the thermal sensing device is positioned adjacent to the power device and configured to produce a signal indicative of an operating temperature of the power device.

The thermal sensing device may include a diode structure responsive to an input current to produce the signal in the form of a voltage across the thermal sensing device having a substantially linear relationship to the operating temperature of the power device. For example, the voltage across the diode structure may decrease, substantially linearly, with increasing temperature. The diode structure may include a number of series-connected diodes each formed of polysilicon. Each of the number of series-connected polysilicon diodes may include a p-type polysilicon region forming a PN junction with an n-type polysilicon region.

The integrated circuit may include a transient-blocking semiconductor layer fabricated on the semiconductor substrate and positioned directly beneath the thermal sensing device, wherein the transient-blocking semiconductor layer is operable to shield the thermal sensing device from voltage transients occurring in the substrate.

The number of series-connected diodes may be arranged along a common axis to form an elongated diode row structure having a bottom surface in contact with the electrical insulation layer and four surrounding sides including a pair of elongated sides and a pair of short sides. Such a diode row structure may be arranged relative to the power device such that at least one of the pair of long sides is positioned adjacent to a heat-generating portion of the power device. The diode row structure may alternatively be arranged relative to the power device such that both of the pair of long sides are positioned adjacent to the heat-generating portion of the power device.

The power device may be an insulated gate bipolar transistor, MOS power transistor, or other power device.

These and other features of the present invention will become more apparent from the following description of the illustrative embodiments.

DESCRIPTION OF THE ILLUSTRATIVE EMBODIMENTS

Figure 1:
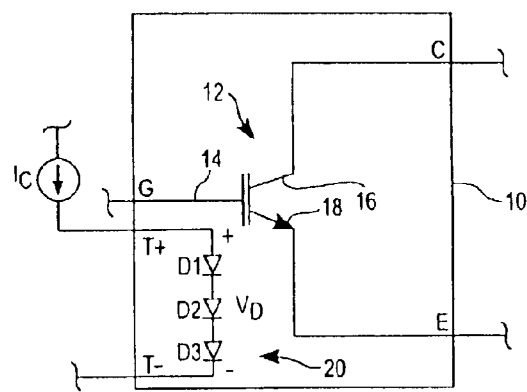
FIG. 1 is a schematic diagram of an integrated circuit including a semiconductor power device and a thermal sensing circuit configured to produce a signal indicative of the operating temperature of the power device.

Referring now to FIG. 1, a schematic diagram is shown illustrating one embodiment of an integrated circuit 10 including a semiconductor power device 12 and a thermal sensing device 20 fabricated thereon. In the embodiment shown, the semiconductor power device 12 is illustrated as an insulated gate bipolar transistor (IGBT) of known construction and having a gate 14 defining a gate input, G, of circuit 10, a collector 16 defining a collector input, C, of circuit 10 and an emitter 18 defining an emitter output, E, of circuit 10. In one embodiment, the gate, G, and emitter, E, outputs of the IGBT are defined in a conventional manner on the top side of integrated circuit 10, while the collector, C, output is defined as the substrate of integrated circuit 10. In this embodiment, electrical contact to the collector, C, of the IGBT may accordingly be made to the backside of the integrated circuit 10, as is known in the art. It is to be understood, however, that other output configurations for the gate, G, emitter, E, and collector, C, terminals of the IGBT are contemplated. Those skilled in the art will recognize that the semiconductor power device 12 may alternatively be, or include, other known semiconductor power switching devices. Examples of such alternative semiconductor power switching devices include, but are not limited to, metal oxide semiconductor (MOS) devices, including CMOS, DMOS and/or other known MOS variants, one or more bipolar power transistors, including Darlington transistor pairs, and the like.

The thermal sensing device 20 is configured to produce a signal indicative of the operating temperature of the power device 12. Control circuitry (not shown) is responsive to the signal produced by the thermal sensing device 20 to monitor the operating temperature of the power device 12, and to control the operation of the power device 12 as a function of this signal in a manner that limits its maximum operating temperature. While it is recognized that such control circuitry may take many forms, one embodiment of such control circuitry that is particularly suited for use with integrated circuit 10 is illustrated and described in co-pending U.S. patent application Ser. No. 10/287,033, entitled THERMAL OVERLOAD PROTECTION CIR- CUIT FOR AN AUTOMOTIVE IGNITION SYSTEM, filed concurrently on Nov. 4, 2002, which is assigned to the assignee of the present invention, and the disclosure of which is expressly incorporated herein by reference.

In the embodiment illustrated in FIG. 1, the thermal sensing device 20 includes three series-connected diodes D1–D3, wherein an anode of D1 is connected to a positive thermal voltage output, T+, and the cathode of D3 is connected to a reference thermal voltage output, T–, of the integrated circuit 10. Those skilled in the art will recognize that more or fewer diodes may be included in the diode string 20 illustrated in FIG. 1, and that the actual number of diodes used will typically result from one or more design considerations relating to the particular application of integrated circuit 10. In any case, a current source, $I_C$, external to integrated circuit 10 supplies an input current to the T+ input of integrated circuit 10, such that a diode voltage, $V_D$, is developed across the diode string between T+ and T–. The external current source, $I_C$, may or may not be included with the control circuitry (not shown) operable to control the power device 12 as a function of the signal produced by the thermal sensing device 20 in a manner that limits its maximum operating temperature.

Figure 2:
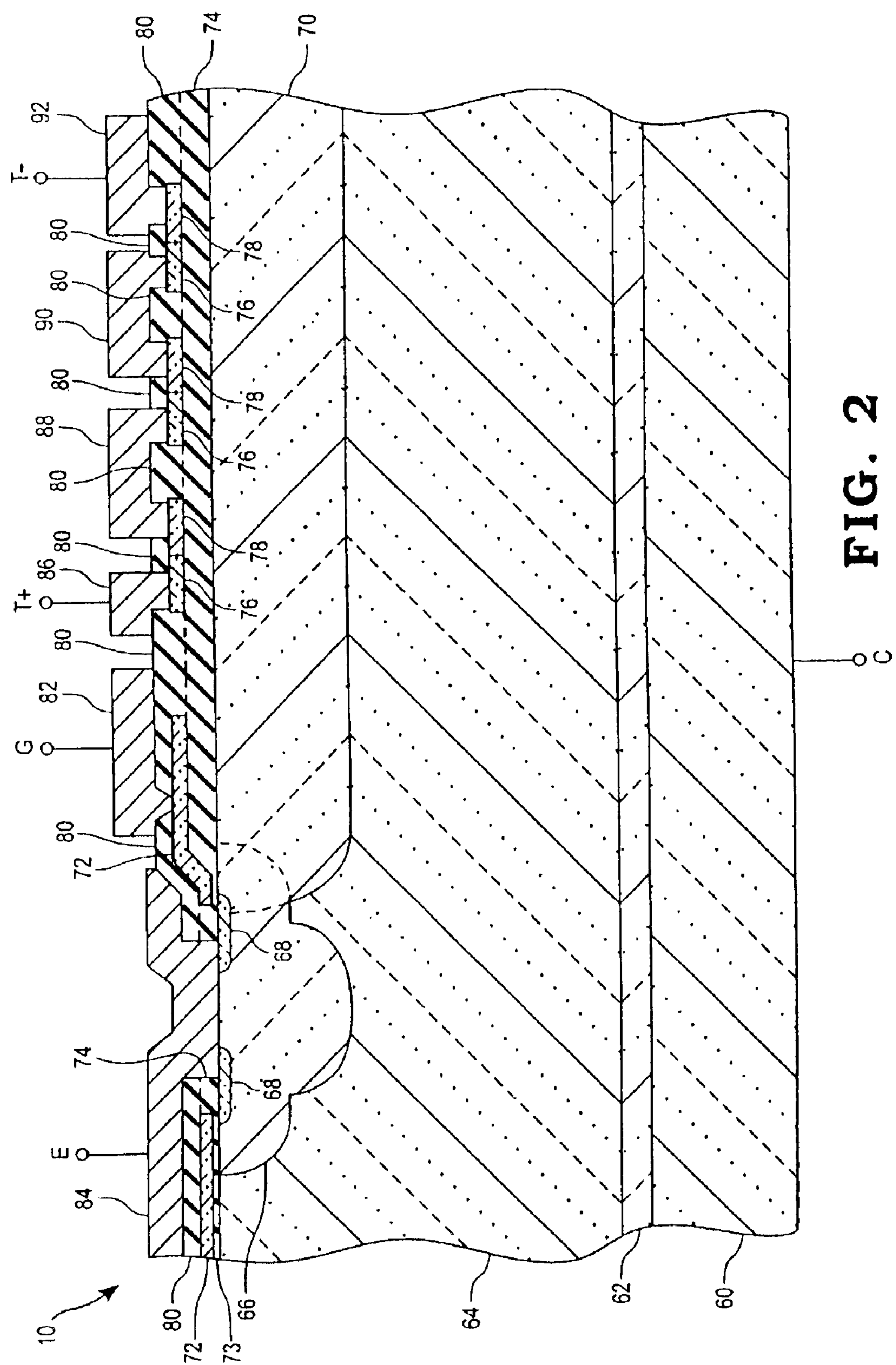
FIG. 2 is a cross-sectional view of one illustrative embodiment of the integrated circuit of FIG. 1.

Polysilicon is a common material used for the internal gate layer of MOS devices, including, for example, power DMOS and IGBTs. It is also known that electrically functional diodes can be fabricated with polysilicon, and in one embodiment the thermal sensing device 20 is constructed from a string of polysilicon diodes formed on a dielectric layer disposed over, and electrically insulated from, the semiconductor power device 12. Referring to FIG. 2, for example, a cross-sectional view of one embodiment of the integrated circuit 10 of FIG. 1 is shown illustrating construction of a portion of the semiconductor power device 12 in the form of an IGBT, and of the thermal sensing device 20 in the form of three series-connected polysilicon diodes. Integrated circuit 10 includes a P+ semiconductor substrate 60 upon which an N+ buffer layer 62 is grown or otherwise formed. An N-type epitaxial layer 64 is then grown or otherwise formed on the buffer layer 60.

An electrical insulation layer 74, e.g., $SiO_2$, silicon nitride ($Si_3 N_4$), polyimide, or the like, is grown or otherwise formed on the N-epitaxial layer 64. Electrical insulation layer 74, sometimes referred to as a "field oxide" layer, is selectively removed in areas that will contain active cells of the IGBT 12, and gate oxide 73 is grown or otherwise formed in these areas. A layer of conductive gate material 72, e.g., polysilicon, is deposited or otherwise formed on top of the gate oxide layer 73, and layers 72 and 73 are then patterned to form the gate 14 of IGBT 12, as shown in FIG. 1.

A series of equally spaced apart P+ wells 66 (only one shown in FIG. 2 for ease of illustration) are then diffused or implanted into the N-epitaxial layer 64 such that a portion of gate 72 and gate oxide 73 overlaps adjacent P+ wells 66. During the P+ diffusion or implantation process, a P+ region 70 is diffused or implanted in a region of the N-epitaxial layer 64 under which the thermal sensing device 20 will be formed, and adjacent to the IGBT 12. In one embodiment, as illustrated in FIG. 2, the P+ region 70 is merged into one or more of the P+ wells 66 forming part of the IGBT 12. Within each of the P+ wells 66, a pair of equally spaced-apart N+ wells 68 are diffused or implanted therein. The P+ well 66 and N+ well 68 pairs thus define a series of IGBT "cells" within the N-epitaxial layer 64. In comparison with FIG. 1, collector 16 of IGBT 12 corresponds to P+ substrate 60, gate 14 corresponds to gate areas 72, and emitter 18 corresponds to the combination of P+ wells 66 and N+ wells 68. With the exception of P+ well 70, the foregoing IGBT structure has been described as being constructed in accordance with a known self-aligned gate process, although it should be understood that IGBT 12 may alternatively be constructed in accordance with any known semiconductor fabrication techniques.

On top of electrical insulation layer 74 above P+ well 70, and therefore completely dielectrically isolated from IGBT 12, thermal sensing device 20 is formed. Diodes D1, D2 and D3 are formed at the same time that the polysilicon gates 72 are formed by growing or otherwise forming three polysilicon regions above P+ well 70. These polysilicon regions are then selectively masked and doped using conventional integrated circuit processes to form diodes each consisting of a P-type region 76 and an N-type region 78. With the process illustrated and described with respect to FIG. 2, formation of diodes D1–D3 requires no additional process steps or cost, as same the P+ diffusion or implant process used to form P+ wells 66 is also used to form the P-type polysilicon regions 76 of diodes D1–D2, and the same N+ diffusion or implant process used to form N+ wells 68 is used to form the N+ polysilicon regions 78 of diodes D1–D3. This combination creates PN junction polysilicon diodes that may be connected in series to form the thermal sensing device 20.

An electrical insulation layer 80, e.g., $SiO_2$, is formed on all of the foregoing layers, such as in accordance with a known low temperature oxide (LTO) forming process. Contact holes are then selectively etched or otherwise formed in electrical insulation layer 80, and a metalization layer is deposited onto the electrical insulation layer. The metalization layer is then selectively etched to form an emitter region 84 in contact with each of the emitter regions 66,68 of the IGBT 12, a gate region 82 in contact with each of the gates 72 of the IGBT 12, a T+ diode output region 86 in contact with the P+ end 76 of diode D1, a T– diode output region 92 in contact with the N– end 78 of diode D3 and regions 88 and 90 connecting in series diodes D1 and D2, and D2 and D3 respectively.

Figure 3:
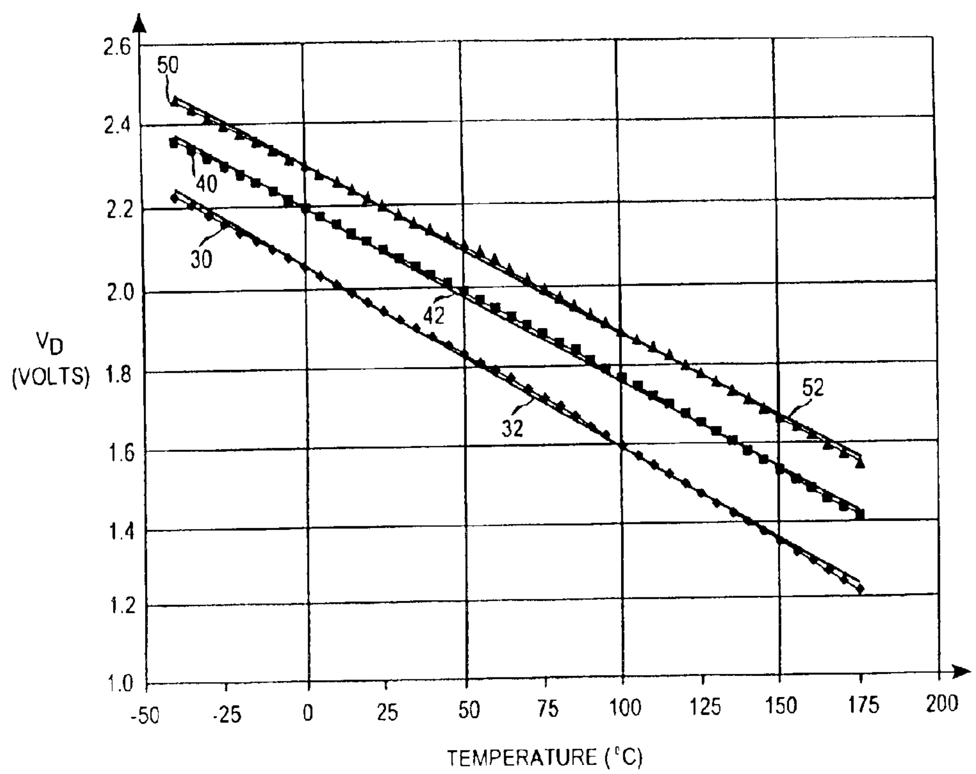
FIG. 3 is a plot of the voltage across one embodiment of the diode string illustrated in FIG. 1 vs. temperature for different diode current levels.

The polysilicon diodes D1–D3 are electrically isolated from all three terminals of the power switch by the field oxide dielectric layer 74, thereby preventing any electrical interaction therebetween. Additionally, the polysilicon diodes are field plated by the P+ region 70 positioned directly beneath diodes D1–D3, so that region 70 acts as a transient-blocking layer operable to shield the diodes D1–D3 from collector voltage transients. It is desirable to position the thermal sensing device 20, formed as a series-connection of three diodes D1–D3, adjacent to the power device 12 such that its operating temperature is substantially the same as that of the power device 12. Alternatively, the thermal sensing device 20 may be positioned relative to the power device 12 such that while its operating temperature may not be the same as that of the power device 12, it closely tracks that of the power device 12. In either case, the diode voltage, $V_D$, produced by the thermal sensing device 20 in response to the constant current supplied by current source $I_C$ will be representative of the operating temperature of the power device 12. Referring to FIG. 3, this diode voltage, $V_D$, is plotted against temperature (° C.) for three different values of constant current, $I_C$. Data sets 30, 40 and 50 correspond to current values, $I_C$, of 10, 40 and 100 microamperes, respectively. As is evident from regression lines 32, 42 and 52, the three-diode stack D1–D3 produces a substantially linear voltage response, $V_D$, to each of the three current values, $I_C$, over temperature.

It has been determined that a single polysilicon diode of the type illustrated and described with respect to FIG. 2 will change at approximately −2 mV/° C., a series-connected row or stack of three diodes will have a slope of approximately −6 mV/° C., and a series-connected stack of five diodes will have a slope of approximately −10 mV/° C. The actual slope of the three-diode row or stack illustrated in FIG. 3 is −4.68 mV/° C. As described hereinabove, the actual number of diodes used to form the thermal sensing device 20 may vary to suit the particular application, and the output voltage sensitivity of the resulting device 20 represents one example consideration in the design of device 20.

Figure 4:
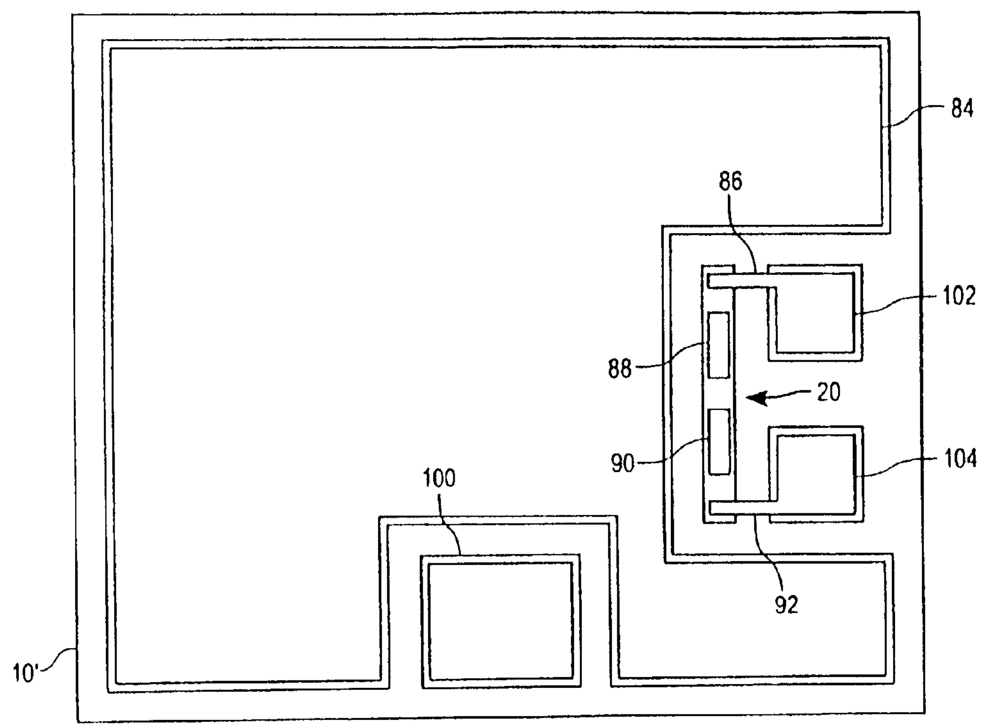
FIG. 4 is a top plan view of one illustrative layout of the integrated circuit of FIG. 1.

In one embodiment, as at least partially illustrated in FIG. 2, the series-connected diodes D1–D3 are arranged along a common axis to form an elongated diode row structure having a bottom surface in contact with the electrical insulation layer 74 and four surrounding sides including a pair of elongated sides and a pair of short sides. In general, the diode structure comprising diodes D1–D3 may be arranged in a number of configurations and orientations relative to the IGBT 12, and one such orientation of the thermal sensing device 20 relative to the IGBT 12 is illustrated in FIG. 4. Referring to FIG. 4, a top plan view of the integrated circuit 10 is shown illustrating one configuration of a layout of the IGBT 12 and thermal sensing device 20. In FIG. 4, the metal layer 84 forming the emitter of the IGBT 12 covers a substantial portion of circuit 10 as is conventional, and a conventional bond pad for making an electrical connection to the IGBT emitter is typically defined on metal layer 84. A bond pad 100 for making an electrical connection to the gate of the IGBT 12 is formed adjacent to metal layer 84, and in the embodiment illustrated in FIG. 4 the thermal sensing device 20 is arranged relative to the IGBT 12 such that one of its long sides is positioned adjacent to the heat generating portion; i.e., the emitter, of the IGBT 12. Conventional bond pads 102 and 104 are formed adjacent to device 20 for making electrical connections to the T+ and T− terminals illustrated in FIG. 1.

Figure 5:
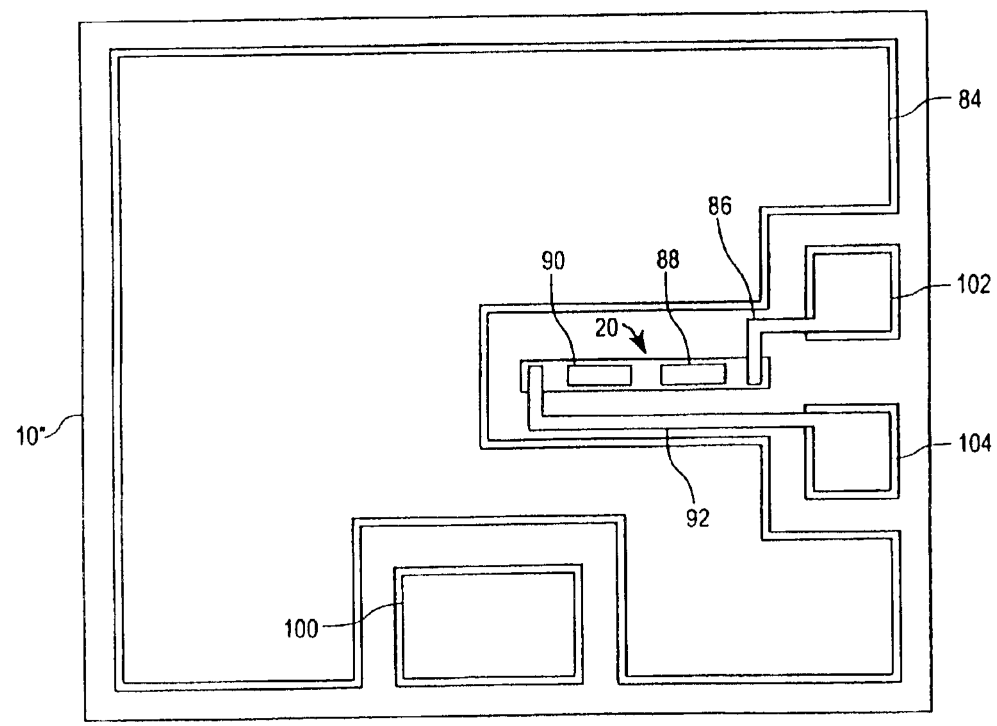
FIG. 5 is a top plan view of another illustrative layout of the integrated circuit of FIG. 1.

Referring to FIG. 5, a top plan view of the integrated circuit 10 is shown illustrating an alternative configuration of a layout of IGBT 12 and thermal sensing device 20. The layout of FIG. 5 is similar to that of FIG. 4 with the exception that the thermal sensing device 20 is arranged relative to the IGBT 12 such that both of its long sides are positioned adjacent to the heat generating portion of the IGBT 12.

Those skilled in the art will recognize that while the one-sided layout of FIG. 4 may be easier to integrate relative to the power device 12, the two-sided layout of FIG. 5 will have better accuracy and thermal transient response. Other configurations and orientations of the thermal sensing device 20 relative to the power device 12 will occur to those skilled in the art, and any such configuration is intended to fall within the scope of the present invention.

While the invention has been illustrated and described in detail in the foregoing drawings and description, the same is to be considered as illustrative and not restrictive in character, it being understood that only illustrative embodiments thereof have been shown and described and that all changes and modifications that come within the spirit of the invention are desired to be protected.

What is claimed is:

1. A semiconductor integrated circuit comprising:

a power device fabricated on a semiconductor substrate, said power device having a first plurality of electrical terminals extending therefrom and unconnected to any other electrical device defined by the integrated circuit, each of said first plurality of electrical terminals forming a separate electrical contact on the integrated circuit;

an electrical insulation layer formed over said semiconductor substrate; and a thermal sensing device fabricated on said electrical insulation layer, said thermal sensing device having a second plurality of electrical terminals, separate from said first plurality of electrical terminals, extending therefrom and unconnected to any other electrical device defined by the integrated circuit, each of said second plurality of electrical terminals forming a separate electrical contact on the integrated circuit.

2. The semiconductor integrated circuit of claim 1 wherein said thermal sensing device includes a diode structure responsive to an input current provided to one of said second plurality of electrical terminals to produce a signal at another one of said second plurality of electrical terminals based on a voltage across said thermal sensing device, said signal having a substantially linear relationship to an operating temperature of said power device.

3. The semiconductor integrated circuit of claim 2 wherein said diode structure comprises a number of series-connected diodes each formed of polysilicon.

4. The semiconductor integrated circuit of claim 3 wherein each of said number of series-connected polysilicon diodes includes a p-type polysilicon region forming a pn junction with an n-type polysilicon region.

5. The semiconductor integrated circuit of claim 3 wherein said number of series-connected diodes are arranged along a common axis to form an elongated diode row structure having a bottom surface in contact with said electrical insulation layer and four surrounding sides including a pair of elongated sides and a pair of short sides.

6. The semiconductor integrated circuit of claim 5 wherein said diode row structure is arranged relative to said power device such that at least one of said pair of long sides is positioned adjacent to a heat-generating portion of said power device.

7. The semiconductor integrated circuit of claim 6 wherein said diode row structure is arranged relative to said power device such that both of said pair of long sides are positioned adjacent to a heat-generating portion of said power device.

8. The semiconductor integrated circuit of claim 1 wherein said power device is an insulated gate bipolar transistor.

9. The semiconductor integrated circuit of claim 1 further including a transient-blocking semiconductor layer fabricated on said semiconductor substrate and positioned directly beneath said thermal sensing device, said transient-blocking semiconductor layer shielding said thermal sensing device from voltage transients occurring in said substrate.

* * * * *